United States Patent
Kadokura

[11] Patent Number: 5,158,657
[45] Date of Patent: Oct. 27, 1992

[54] CIRCUIT SUBSTRATE AND PROCESS FOR ITS PRODUCTION

[75] Inventor: Susumu Kadokura, Sagamihara, Japan

[73] Assignee: Canon Kabushiki Kaisha, Tokyo, Japan

[21] Appl. No.: 673,028

[22] Filed: Mar. 21, 1991

[30] Foreign Application Priority Data

| Mar. 22, 1990 | [JP] | Japan | 2-75148 |
| Mar. 23, 1990 | [JP] | Japan | 2-72177 |
| Mar. 23, 1990 | [JP] | Japan | 2-74653 |
| Mar. 24, 1990 | [JP] | Japan | 2-74203 |
| Mar. 26, 1990 | [JP] | Japan | 2-77494 |
| Mar. 26, 1990 | [JP] | Japan | 2-77495 |

[51] Int. Cl.$^5$ .................................. C25D 13/04
[52] U.S. Cl. ............................ 204/181.1; 205/125
[58] Field of Search ...................... 204/181.1, 180.2

[56] References Cited

U.S. PATENT DOCUMENTS

| 4,579,882 | 4/1986 | Kanbe et al. | 252/513 |
| 4,601,916 | 7/1986 | Arachtingi | 204/181.2 |

FOREIGN PATENT DOCUMENTS

| 223763 | 12/1984 | Japan . |
| 089585 | 4/1989 | Japan . |
| 214100 | 8/1989 | Japan . |
| 022885 | 1/1990 | Japan . |
| 138798 | 5/1990 | Japan . |

Primary Examiner—John Niebling
Assistant Examiner—Kishor Mayekar
Attorney, Agent, or Firm—Fitzpatrick, Cella, Harper & Scinto

[57] ABSTRACT

A circuit substrate has a substrate, a conductor wire provided on the substrate, a first insulating film that covers the conductor wire, and a conductive film that covers the first insulating film. At least one of the first insulating film and the conductive film is formed by electro-deposition coating.

18 Claims, 1 Drawing Sheet

CIRCUIT SUBSTRATE AND PROCESS FOR ITS PRODUCTION

BACKGROUND OF THE INVENTION

1. Field of the Invention

The present invention relates to a circuit substrate and a process for producing it. More particularly the present invention relates to a circuit substrate used in optical instruments such as cameras, home electric appliances, computers, word processors, measuring devices or the like, and a process for producing such a circuit substrate.

2. Related Background Art

Conventional processes commonly used to produce circuit substrates comprise the steps of (1) forming a copper foil circuit pattern on an insulated substrate by photolithography, or by screen printing using a conductive paste, (2) thereafter coating a solder resist or the like on the surface of the circuit to provide thereon an insulating layer, (3) subsequently coating a conductive paste on the surface of the insulating layer to provide thereon a shielding layer, and (4) further coating a solder resist or the like on the shielding layer to provide thereon an insulating layer. Methods for electromagnetic wave shielding may include, in addition to a method of providing the above shielding layer, a method in which shielding is effected by surrounding a circuit substrate with a sheet metal. The insulating layer on the circuit pattern can also be provided by laminating a dry film.

The conventional processes for producing circuit substrates, however, provide an insulating layer having a small thickness at the corners of copper wires that constitute a this arrangement results in a break of the insulating layer at the parts corresponding thereto. The conventional processes for producing circuit substrates also tend to cause a dielectric breakdown or defective insulation because of inclusion of bubbles or the like between copper wires, exacerbating the problem. In addition, the conventional processes for producing circuit substrates require complicated production steps which take a long time for their manufacture, also bringing about a problem in cost.

As for the conventional method in which shielding is effected by surrounding a circuit substrate with a sheet metal, it requires a broad space in order for the metal sheet to be provided, and hence has been not suitable for making products small-sized.

SUMMARY OF THE INVENTION

The present invention was made in order to overcome such disadvantages involved in the prior art. An object of the present invention is to provide a circuit substrate can provide uniform layer thicknesses for the insulating layer and shielding layer on a circuit pattern, can be free from defective insulation, and can also promise a high electromagnetic wave shielding effect, and a process for producing such a circuit substrate.

The circuit substrate of the present invention comprises a substrate, a conductor wire provided on said substrate, a first insulating film that covers said conductor wire, and a conductive film that covers said first insulating film; at least one of said first insulating film and said conductive film is formed by electro-deposition coating.

The process for producing a circuit substrate of the present invention comprises a first step of forming on a substrate a circuit pattern comprised of a conductor wire, a second step of providing a first insulating film to cover said circuit pattern, and a third step of providing a conductive film to cover said first insulating film. Electro-deposition coating is used in at least one step of said second step and said third step. Said electro-deposition coating is carried out by immersing said substrate in an electro-deposition coating composition, setting said conductor wire as an electrode.

DESCRIPTION OF THE PREFERRED EMBODIMENTS

Figure 1:
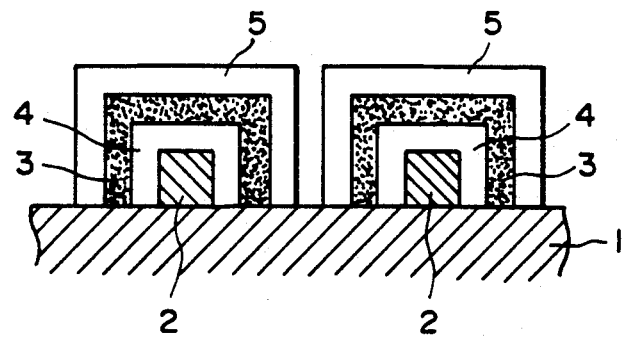
FIG. 1 is a cross-section illustrating an example of the construction of the circuit substrate according to the present invention.

The circuit substrate of the present invention can be used in all sorts of electric apparatuses including optical instruments such as cameras, home electric appliances, word processors, computers and measuring devices. The circuit substrate of the present invention comprises, as shown in FIG. 1, an insulated substrate 1 having a conductor wire 2 formed thereon, a first insulating film 4 that covers the whole surface of the conductor wire 2, and a conductive film 3 that covers the whole surface of the first insulating film 4. The conductive film 3 serves as a shielding layer that effects electromagnetic wave shielding. The conductor wire 2 forms a circuit pattern on the insulated substrate 1. The conductor wire 2 may preferably be formed of copper. The whole surface of the insulating film 4 may optionally be covered with an additional insulating film 5 (a second insulating film). The insulating film 5 is provided to prevent the circuit substrate of the present invention from contacting other component parts to short, when it has been set in an electric apparatus.

In the circuit substrate of the present invention, at least one of the films 3, 4 and 5 is formed by electro-deposition coating. A coating formed by the electro-deposition coating is finally cured by heating or irradiation with light.

The electro-deposition coating refers to a process in which a pair of electrodes are disposed in a solution in which a substance that gives a coating film has been dissolved (hereinafter "electro-deposition coating composition") and a DC current is applied to cause the substance to adhere onto one of the electrodes. Thus, in the present invention, the conductor wire 2 formed on the substrate serves as one of the electrodes. As the other electrode, it is preferred to use, for example, a stainless steel plate.

Proposals have been hitherto made on the electro-deposition coating. For example, Japanese Patent Application Laid-open No. 55-11175 proposes a method in which an electro-deposition coating composition is applied twice superposingly. The present applicants have also proposed in Japanese Patent Application Laid-open No. 2-6564 an electro-deposition coating composition containing a ceramic powder and a fluorine resin powder.

As the insulated substrate 1, it is possible to use commonly known insulated substrates as exemplified by those made of a polycarbonate resin, a polyetherimide resin, a glass fiber packed ABS resin, a glass epoxy resin or the like.

The circuit pattern formed by the use of the conductor wire 2 can be formed by commonly known photolithography. More specifically, the circuit pattern can be formed by laminating, for example, copper foil on the insulated substrate 1, further coating a resist on the copper foil, and then exposing the resist coating to light through a mask having the desired pattern, followed by development and etching.

On the whole surface of the conductor wire 2, the insulating film 4 is formed by electro-deposition coating by the use of a resin feasible for electro-deposition.

Resins used in the electro-deposition coating have been hitherto studied in variety. In order for resin to be electro-deposited, the resin must be capable of being charged when the electro-deposition coating is carried out. The charged resin is attracted toward the anode or cathode when a DC current is applied, and thus deposited on the electrode to give a coating. As the resin used in the present invention, it is possible to use resins conventionally used in electro-deposition coating, as exemplified by those of an acrylic melamine type, an acrylic type, an epoxy type, a urethane type, an alkyd type or the like. The resin used in the present invention may be of either an anionic type or a cationic type. From the viewpoint of practical use, it is preferred to use a water-soluble resin or water-dispersible resin having a carboxyl group. Resin prepolymers having carboxyl groups can be dissolved or dispersed in water after they have been neutralized with ammonia or organic amines.

The resin in the electro-deposition coating composition should be in a concentration of from 5% by weight to 20% by weight, and preferably from 7% by weight to 15% by weight.

The electro-deposition coating composition used in the present invention may preferably be prepared by dissolving or dispersing the desired resin in water. The electro-deposition coating composition may further contain an organic solvent of an alcohol type, a glycol type or the like. Such an organic solvent is enough if it is contained in an amount of several % by weight.

The insulating film 4 may be incorporated with a ceramic powder. The insulating film 4 incorporated with the ceramic powder can be well cured at a low temperature of, for example, from 90° C. to 100° C. when the insulating film 4 is heated to effect curing. As a result, it becomes possible to obtain a circuit substrate free from thermal deformation.

Although it is unclear why the heat curing can be carried out at a low temperature when the electro-deposition coating film is formed using an electro-deposition coating composition containing the ceramic powder, it can be presumed that the ceramic powder is different from metal particles whose surfaces are susceptible to immediate oxidation and its particle surfaces kept activated to a certain degree can be maintained in a stable state, so that the active particle surfaces of the powder serve as cross-link points at the time of curing to accelerate the curing of the coating formed by electro-deposition.

The ceramic powder incorporated into the insulating film 4 includes, for example, aluminum oxide, titanium nitride, manganese nitride, tungsten nitride, tungsten carbide, lanthanum nitride, aluminum silicate, molybdenum disulfide, titanium oxide, graphite, and silicic acid compounds.

A ceramic powder with an excessively large particle diameter brings about an excessive curing of the insulating film 4 to make the film brittle. On the other hand, a ceramic powder with an excessively small particle diameter makes it impossible to achieve a sufficient effect. Hence, the ceramic powder may preferably have an average particle diameter ranging from 0.1 $\mu$m to 5 $\mu$m, and particularly from 0.5 $\mu$m to 2 $\mu$m.

As to the amount of the ceramic powder contained in the electro-deposition coating composition used to form the insulating film 4, the ceramic powder may preferably be in an amount of from 0.5 part by weight to 30 parts by weight, and particularly from 2 parts by weight to 25 parts by weight, based on 100 parts by weight of the resin feasible for electro-deposition, in order to obtain a coating that can give good coating film properties, e.g., adhesion, and also can be cured even at a low temperature. The ceramic powder may preferably be contained in the insulating film 4 in a deposition quantity of from 10% by weight to 30% by weight, and particularly from 15% by weight to 25% by weight.

The reason why the powder can be deposited in the coating formed as a result of the electro-deposition coating carried out using the electro-deposition coating composition containing the powder is presumed due to the fact that resin molecules are adsorbed around powder particles in the electro-deposition coating composition and the resin molecules are attracted toward the electrode, with which the powder also is moved toward the electrode.

After the formation of the insulating film 4, the conductive film 3 is formed on the whole surface of the insulating film 4. The conductive film 3 is formed by electro-deposition coating using an electro-deposition coating composition containing a conductive powder. As the conductive powder contained in the electro-deposition coating composition, it is preferred to use a ceramic powder whose particle surfaces are coated with a metal (hereinafter "metallized ceramic powder") or a natural mica powder whose particle surfaces are coated with a metal (hereinafter "metallized natural mica powder"). Only one of the metallized ceramic powder and the metallized natural mica powder may be contained in the electro-deposition coating composition, or both of them may be contained in the form of a mixture. Incorporation of the metallized ceramic powder or metallized natural mica powder in the electro-deposition deposition coating composition is preferable since, as previously described, it enables complete curing at a low temperature of from 90° C. to 100° C., which is usually required to be 130° C. to 180° C. as a heating temperature, when the electro-deposition coating is cured by heat treatment after completion of electro-deposition.

The metallized ceramic powder or metallized natural mica powder used in the present invention may include a ceramic powder or natural mica powder whose particles surfaces are coated with Cu, Ni, Ag, Au, Sn or the like. For the coating of the particle surfaces of these powders, Cu, Ag, and Ni can be preferably used in view of the shielding performance and cost. As a method for the coating of the powder particle surfaces, it is suitable to use electroless plating. A superior shielding performance and good coating film properties at the time of low-temperature curing can be obtained when the powder particle surfaces are coated in a coating thickness of from 0.05 $\mu$m to 3 $\mu$m, and particularly from 0.15 $\mu$m to 2 $\mu$m. Formation of coatings with a thickness of more than 3 μm makes the surface properties analogous to those of metal particles, so that the coatings are oxidized in the air because of their very active surfaces to tend to result in an insufficient curing of electro-deposition coatings at the time of low-temperature curing.

When Ni coatings are formed on the powder particles, the method as disclosed, for example, in Japanese Patent Application Laid-open No. 61-276979 can be used, according to which a water-based suspension of the powder is prepared, and then an aged solution for electroless nickel plating is added to the suspension to form nickel coatings on the powder particle surfaces so that Ni coatings with a low phosphorus content, e.g., of 5% or less can be applied. Thus it is possible to form an electro-deposition coating having an improved conductivity and substantially the same shielding properties as in Cu-coated powder.

As the ceramic powder used in the conductive powder, it is possible to use the same ceramic powder as the one incorporated into the insulating film 4. The natural mica may include phlogopite, serisite and muscovite.

The metallized ceramic powder and the metallized natural mica powder should have an average particle diameter of from 0.1 μm to 5 μm, and preferably from 0.5 μm to 2 μm. A powder with an average particle diameter smaller than 0.1 μm may cause secondary agglomeration. On the other hand, a powder with an average particle diameter larger than 5 μm is not preferred in view of a problem of sedimentation of particles or decorativeness of coating films.

As the conductive particles, in addition to the metallized ceramic powder and the metallized natural mica powder, it is also possible to use a resin powder whose particle surfaces are coated with a metal (hereinafter "metallized resin powder") or a metal powder.

As the resin powder used in the metallized resin powder, it is possible to use, for example, fluorine resins, polyethylene resins, acrylic resins, polystyrene resins and nylons. The metal coating applied to the surfaces of the resin powder particles may be the same as used in the case of the metallized ceramic powder. The metallized resin powder may also have the same average particle diameter as in the case of the metallized ceramic powder.

The metal powder includes, for example, powders of Au, Pd, Ag, Ni, Cu, Sn, Co, Mn, Fe, Te, etc. The metal powder should have an average particle diameter ranging from 0.01 μm to 5 μm, preferably from 0.05 μm to 4 μm, and more preferably from 0.05 μm to 0.1 μm. A powder with an average particle diameter smaller than 0.01 μm may cause secondary agglomeration. On the other hand, a powder with an average particle diameter larger than 5 μm may result in sedimentation of particles in the electro-deposition coating composition. It is preferred for the metal powder to be those produced by, for example, heat plasma evaporation.

In the present invention, the particle diameters of the conductive powder are values measured using a centrifugal sedimentation type particle size distribution measuring device. What is actually used as this measuring device is SACP-3 (trade name; manufactured by Shimadzu Corporation).

The conductive powder should be contained in the electro-deposition coating composition in an amount ranging from 0.2 part by weight to 30 parts by weight, preferably from 10 parts by weight to 20 parts by weight, and more preferably from 7 parts by weight to 15 parts by weight, based on 100 parts by weight of the resin feasible for electro-deposition.

The presence of the conductive powder in the conductive film 3 can be determined using an X-ray microanalyzer. The deposition quantity of the conductive powder can be measured by analysis according to thermogravimetry analysis. The deposition quantity of the conductive powder in the coating film 3 may preferably be in the range of from 5% by weight to 50% by weight, particularly from 10 % by weight to 40% by weight, and more preferably from 15% by weight to 35% by weight.

As the conductive powder contained in the conductive film 3, only one of the metallized ceramic powder, the metallized natural mica powder, the metallized resin powder and the metal powder may be used, or two or more of them as exemplified by the metallized ceramic powder and the metal powder may be used. It is preferred to use a conductive powder comprised of a mixture of at lease one conductive powder selected from the metallized ceramic powder and the metallized natural mica powder and at least one conductive powder selected from the metallized resin powder and the metal powder. This is because the gaps between particles of the metallized ceramic powder and/or metallized natural mica powder are filled with particles of the metal powder and/or metallized resin powder to increase contact areas between each powder, so that the shielding properties can be more improved and also the conductive film 3 can be cured at the low temperature by the action of the metallized ceramic powder and/or metallized natural mica powder. In this instance, the conductive powders may preferably be mixed in such a proportion that at least one conductive powder selected from the metallized resin powder and the metal powder is in an amount of from 20 parts by weight to 300 parts by weight based on 100 parts by weight of at least one conductive powder selected from the metallized ceramic powder and metallized natural mica powder.

Because of the formation of the conductive film 3 by electro-deposition coating, the conductive powder can be deposited in the conductive film 3 in a high density, and the film 3 can exhibit a superior shielding performance even if it is a thin film.

After the formation of the conductive film 3, the insulating film 5 is optionally formed on the whole surface of the conductive film 3. The insulating film 5 may be formed using the same material as the materials described in respect of the insulating film 4 and in the same manner as the formation of the insulating film 4. Accordingly, the ceramic powder may be incorporated or need not be incorporated also in respect of the insulating film 5. The ceramic powder may be contained in both the insulating film 4 and insulating film 5 or may be contained in only one of them. Alternatively, the ceramic powder may be contained in neither the insulating film 4 nor the insulating film 5.

After the insulating film 4, the conductive film 3 and the optional insulating film 5 are formed on the whole surface of the conductor wire 2, the insulating films 4 and 5 and the conductive film 3 are cured by heat or light, or by both of them. The energy by which the resin is cured may be either of heat and light, but heat is preferred in view of the advantage that it can be applied uniformly and yet with ease. The films may be cured preferably at a temperature of from 90° C. to 100° C. for a heating time of from 20 minutes to 180 minutes. It is also possible to effect curing of the insulating films or the conductive film by the use of energy other than heat and light.

The insulating film 4 may preferably have a thickness of from 5 μm to 30 μm, and more preferably from 7 μm to 25 μm.

The conductive film 3 may preferably have a thickness of from 7 μm to 40 μm, and more preferably from 10 μm to 25 μm.

The insulating film 5 optionally provided may preferably have a thickness of from 10 μm to 30 μm, and more preferably from 10 μm to 25 μm.

In the case when the insulating films 4 and 5 and the conductive film 3 are formed by electro-deposition coating, the substrate made to serve as one electrode is immersed in an electro-deposition coating composition together with the other electrode to carry out the electro-deposition coating. The electro-deposition coating composition may preferably be kept at a temperature of from 20° C. to 25° C. and have a hydrogen-ion concentration corresponding to pH 8 to 9. The voltage to be applied may preferably be a DC voltage of from 50 V to 170 V and the electro-deposition may preferably be carried out at a current density of from 0.5 A/dm² to 3 A/dm² for a treatment time of from 1 minute to 5 minutes. The resins used for the insulating films 4 and 5 and the conductive film 3 may be changed in their kinds for each film.

As described above, the present invention makes it possible to form the insulating film and conductive film of a circuit substrate as thin films which are dense and uniform in thickness. It also makes it possible to obtain a circuit substrate free from defective insulation and having a superior electromagnetic wave shielding effect.

The present invention will be described below in greater detail by giving Examples. The present invention is by no means limited to these Examples only.

EXAMPLE 1

To the surface of a glass epoxy resin substrate of 0.6 mm thick, laminated thereon with copper foil of 18 μm thick, a negative resist (trade name: OMR-83; produced by Tokyo Ohka Kogyo Co., Ltd.; viscosity: 450 cp) was applied by spin coating to form a photosensitive material layer of 5 μm thick. Subsequently, the resist coating was exposed to light using pattern masks of from 0.5 to 50 mm in line width and from 1 to 20 mm in space, followed by development. Next, using a copper etchant (trade name: Alfine; produced by Uemura Kogyo K.K.), etching was carried out according to a spray system to form a copper circuit pattern.

Thereafter, using an electro-deposition coating composition prepared by diluting an acrylic melamine resin (trade name: Honey Bright CL-1; produced by Honey Chemical Co.) with desalted water to a concentration of 15% by weight, a DC voltage of 150 V was applied for 3 minutes under conditions of pH 8.5 and a bath temperature of 25° C., setting the substrate as the anode and a stainless steel sheet as the cathode. Thus an insulating film 4 of 15 μm thick was formed on the copper circuit pattern.

Next, in an electro-deposition coating composition prepared by dispersing, in 100 parts of an acrylic melamine resin (trade name: Honey Bright CL-1; produced by Honey Chemical Co.) separately made ready for use, 15 parts by weight of an alumina powder with an average particle diameter of 0.7 μm whose particle surfaces were coated with nickel in a thickness of 0.2 μm and further diluting the dispersion with desalted water to 15% by weight as concentration of a mixture of the resin and the powder, a conductive film 3 of 17 μm thick was formed on the whole surface of the insulating film 4 under the same conditions as those for the formation of the insulating film 4.

Then, using the same electro-deposition coating composition as used for the insulating film 4, an insulating film 5 of 15 μm thick was further formed on the whole surface of the conductive film 3 under the same conditions as those for the formation of the insulating film 4.

Finally, the resulting substrate was washed with water and then put the substrate in an oven of 97° C.±1° C. to carry out heat treatment for 150 minutes. A circuit substrate of the present invention was thus obtained.

Physical properties (adhesion, resistance to acids, resistance to alkalis and resistance to flame), insulation resistance and specific volume resistance of the resulting circuit substrate were evaluated or measured. Results obtained are shown in Tables 1 to 3 below.

The resulting insulating film and conductive film were dense and well adhered to adjoining films, having satisfactory resistance to acids, resistance to alkalis and resistance to flame.

Figure 2:
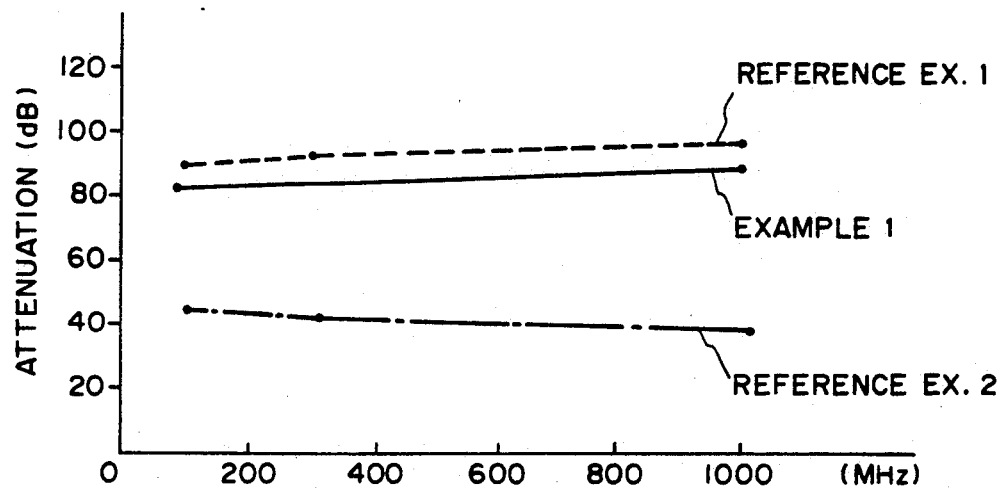
FIG. 2 is a graph illustrating an electromagnetic wave shielding effect of the circuit substrate according to the present invention.

The electromagnetic wave shielding effect of the circuit substrate was also measured by the transmission line method (ASTM ES7-83 Method) after it was set in an apparatus. The result is shown in FIG. 2. As shown in FIG. 2, the electromagnetic wave shielding effect was substantially the same as in the case of electroless plating (see Reference Examples 1 and 2).

This circuit substrate was crosscut as shown in FIG. 1 to observe its cross section using a metallurgical microscope (magnifications: 400) manufactured by Olympus Optical Co., Ltd. As a result, it was confirmed that all the insulating films 4 and 5 and the conductive film 3 were formed in uniform thicknesses.

REFERENCE EXAMPLE 1

On an ABS resin substrate, a copper thin film of 0.7 μm thick and a nickel thin film of 0.4 μm thick were successively laminated by electroless plating to give a metal-coated member.

The electromagnetic wave shielding effect of this metal-coated member was measured in the same manner as in Example 1. The result is shown in FIG. 2.

REFERENCE EXAMPLE 2

On an ABS resin substrate, a coating composition comprising a nickel powder was sprayed to form thereon a nickel coating.

The electromagnetic wave shielding effect of the resulting member on which this nickel coating had been formed was measured in the same manner as in Example 1. The result is shown in FIG. 2.

COMPARATIVE EXAMPLE 1

To the surface of the same glass epoxy resin substrate as used in Example 1, a copper circuit pattern was formed in the same manner as in Example 1, and thereafter a solder resist (trade name: FINEDEL DSR-2200(C); produced by Tamura Seisakusho), a silver paste (trade name LS-500; produced by Asahi Kagaku Kenkyusho) and a solder resist (trade name: FINEDEL DSR-2200(C); produced by Tamura Seisakusho) were applied successively from the substrate side in thicknesses of 30 μm, 35 μm and 30 μm, respectively, to give a circuit substrate.

Physical properties, insulation resistance and specific volume resistance of the resulting circuit substrate were evaluated or measured in the same manner as in Example 1. Results obtained are shown in Tables 1 to 3.

TABLE 1

Results of Evaluation on Physical Properties of Film

| Adhesion | Resistance to acids | Resistance to alkalis | Resist. to flame |
|---|---|---|---|
| Example 1: | | | |
| Adhesion rate: 100/100 Completely adhered. | No changes in insulating film. | No changes in insulating film. | Cleared 94V-0. |
| Comparative Example 1: | | | |
| Adhesion rate: 95/100 A little peeled. | A little change in insulating film. | A little change in insulating film. | Cleared 94V-1. |

Notes:
Tests on the items in the above table were carried out by the following methods:
(1) Adhesion: JIS D0202
(2) Resistance to acids: Immersion treatment with 10 vol. % $H_2SO_4$ at room temperature for 20 minutes.
(3) Resistance to alkalis: Immersion treatment with 5 wt. % NaOH at room temperature for 30 minutes.
(4) Resistance to flame: UL94 Test Method.

TABLE 2

Insulation Resistance of Film

| | Initial value | After 96 hour moisture absorption treatment |
|---|---|---|
| Example 1: | $1.7 \times 10^{13} \Omega \cdot cm$ | $1.5 \times 10^{13} \Omega \cdot cm$ |
| Comparative Example 1: | $1.0 \times 10^{13} \Omega \cdot cm$ | $1.6 \times 10^{11} \Omega \cdot cm$ |

Notes:
The insulation resistance in the above table was measured according to JIS Z3197; comb electrode G-10; substrate moisture absorption treatment: at 55° C., 98% RH, DC 500 V for 1 minute. The resistivity was measured using a insulation resistance measuring device HP4329A, manufactured by YHP Co.

TABLE 3

Specific Volume Resistance of Film

| | Initial value | After 96 hour moisture absorption treatment |
|---|---|---|
| Example 1: | $1.5 \times 10^{13} \Omega \cdot cm$ | $1.4 \times 10^{13} \Omega \cdot cm$ |
| Comparative Example 1: | $1.2 \times 10^{13} \Omega \cdot cm$ | $1.8 \times 10^{10} \Omega \cdot cm$ |

Notes:
The above specific resistivity was measured according to JIS C6481.

EXAMPLE 2

A circuit substrate of the present invention was prepared in the same manner as in Example 1 except that 15 parts by weight of the nickel-coated alumina powder used in Example 1 was replaced with 10 parts by weight of copper-coated alumina powder. Coating thickness of the copper-coated alumina powder was 0.2 μm. Average particle diameter of the alumina powder was 1.2 μm.

Physical properties (adhesion, resistance to acids, resistance to alkalis and resistance to flame), insulation resistance, specific volume resistance and electromagnetic wave shielding effect of the resulting circuit substrate were evaluated or measured in the same manner as in Example 1. As a result, the same good results as in Example 1 were obtained.

The cross section of this circuit substrate was also observed in the same manner as in Example 1 to confirm that all the films were formed in uniform thicknesses.

EXAMPLE 3

On a glass epoxy resin substrate of 0.6 mm thick, a copper circuit pattern and an insulating film 4 were formed in the same manner as in Example 1.

Next, in an electro-deposition coating composition prepared by dispersing, in 100 parts by weight of an acrylic melamine resin (trade name: Honey Bright CL-1; produced by Honey Chemical Co.) separately made ready for use, 7 parts by weight of an alumina powder with an average particle diameter of 1.0 μm whose particle surfaces were coated with copper in a thickness of 0.2 μm and further diluting the dispersion with desalted water to 15% by weight as concentration of a mixture of the resin and the powder, a conductive film 3 of 17 μm thick was formed on the whole surface of the insulating film 4 under the same conditions as those for the formation of the insulating film 4.

Finally, the resulting substrate was washed with water and then put the substrate in an oven of 97° C.±1° C. to carry out heat treatment for 150 minutes. A circuit substrate of the present invention was thus obtained.

Physical properties (adhesion, resistance to acids, resistance to alkalis and resistance to flame) and electromagnetic wave shielding effect of the resulting circuit substrate were evaluated or measured in the same manner as in Example 1. As a result, the same good results as in Example 1 were obtained.

The cross section of this circuit substrate was also observed in the same manner as in Example 1 to confirm that all the films were formed in uniform thicknesses.

EXAMPLE 4

On a glass epoxy resin substrate of 0.8 mm thick, a copper circuit pattern was formed in the same manner as in Example 1.

Thereafter, using an electro-deposition coating composition prepared by diluting an alkyd resin (trade name: TF121; produced by Shinto Paint Co., Ltd.) with desalted water to a concentration of 15% by weight, a DC voltage of 150 V was applied for 3 minutes under conditions of pH 8.5 and a bath temperature of 25° C., setting the substrate as the anode and a stainless steel sheet as the cathode. Thus an insulating film 4 of 15 μm thick was formed on the copper circuit pattern.

Next, in an electro-deposition coating composition prepared by dispersing, in 100 parts by weight of an alkyd resin (trade name: TF121; produced by Shinto Paint Co., Ltd.) separately made ready for use, 7 parts by weight of an alumina powder with an average particle diameter of 1.0 μm whose particle surfaces were coated with nickel in a thickness of 0.1 μm and further diluting the dispersion with desalted water to 15% by weight as concentration of a mixture of the resin and the powder, a conductive film 3 of 17 μm thick was formed on the whole surface of the insulating film 4 under the same conditions as those for the formation of the insulating film 4.

Then, using the same electro-deposition coating composition as used for the insulating film 4, an insulating film 5 of 15 μm thick was further formed on the whole surface of the conductive film 3 under the same conditions as those for the formation of the insulating film 4.

Finally, the resulting substrate was washed with water and then put the substrate in an oven of 97° C.±1° C. to carry out heat treatment for 150 minutes. A circuit substrate of the present invention was thus obtained.

Physical properties (adhesion, resistance to acids, resistance to alkalis and resistance to flame), insulation resistance, specific volume resistance and electromagnetic wave shielding effect of the resulting circuit substrate were evaluated or measured in the same manner as in Example 1. As a result, the same good results as in Example 1 were obtained.

The cross section of this circuit substrate was also observed in the same manner as in Example 1 to confirm that all the films were formed in uniform thicknesses.

EXAMPLE 5

On a glass epoxy resin substrate of 0.6 mm thick, a copper circuit pattern and an insulating film 4 were formed in the same manner as in Example 1.

Next, in an electro-deposition coating composition prepared by dispersing, in 100 parts by weight of an acrylic melamine resin (trade name: Honey Bright CL-1; produced by Honey Chemical Co.) separately made ready for use, 10 parts by weight of a copper powder with an average particle diameter of 0.03 $\mu$m and further diluting the dispersion with desalted water to 15% by weight as concentration of a mixture of the resin and the powder, a conductive film 3 of 17 $\mu$m thick was formed on the whole surface of the insulating film 4 under the same conditions as those for the formation of the insulating film 4.

Then, using the same electro-deposition coating composition as used for the insulating film 4, an insulating film 5 of 15 $\mu$m thick was further formed on the whole surface of the conductive film 3 under the same conditions as those for the formation of the insulating film 4.

Finally, the resulting substrate was washed with water and then put the substrate in an oven of 97° C.±1° C. to carry out heat treatment for 150 minutes. A circuit substrate of the present invention was thus obtained.

Physical properties (adhesion, resistance to acids, resistance to alkalis and resistance to flame), insulation resistance, specific volume resistance and electromagnetic wave shielding effect of the resulting circuit substrate were evaluated or measured in the same manner as in Example 1. As a result, the same good results as in Example 1 were obtained.

The cross section of this circuit substrate was also observed in the same manner as in Example 1 to confirm that all the films were formed in uniform thicknesses.

EXAMPLE 6

On a glass epoxy resin substrate of 0.6 mm thick, a copper circuit pattern and an insulating film 4 were formed in the same manner as in Example 1.

Next, in an electro-deposition coating composition prepared by dispersing, in 100 parts by weight of an acrylic melamine resin (trade name: Honey Bright CL-1; produced by Honey Chemical Co.) separately made ready for use, 10 parts by weight of a copper powder with an average particle diameter of 0.02 $\mu$m and further diluting the dispersion with desalted water to 15% by weight as concentration of a mixture of the resin and the powder, a conductive film 3 of 15 $\mu$m thick was formed on the whole surface of the insulating film 4 under the same conditions as those for the formation of the insulating film 4.

Finally, the resulting substrate was washed with water and then put the substrate in an oven of 97° C.±1° C. to carry out heat treatment for 150 minutes. A circuit substrate of the present invention was thus obtained.

Physical properties (adhesion, resistance to acids, resistance to alkalis and resistance to flame) and electromagnetic wave shielding effect of the resulting circuit substrate were evaluated or measured in the same manner as in Example 1. As a result, the same good results as in Example 1 were obtained.

The cross section of this circuit substrate was also observed in the same manner as in Example 1 to confirm that all the films were formed in uniform thicknesses.

EXAMPLE 7

On a glass epoxy resin substrate of 0.6 mm thick, a copper circuit pattern was formed in the same manner as in Example 1.

Thereafter, using an electro-deposition coating composition prepared by diluting an alkyd resin (trade name: TF121; produced by Shinto Paint Co., Ltd.) with desalted water to a concentration of 15% by weight, a DC voltage of 150 V was applied for 3 minutes under conditions of pH 8.5 and a bath temperature of 25° C., setting the substrate as the anode and a stainless steel sheet as the cathode. Thus an insulating film 4 of 15 $\mu$m thick was formed on the copper circuit pattern.

Next, in an electro-deposition coating composition prepared by dispersing, in 100 parts by weight of an alkyd resin (trade name: TF121; produced by Shinto Paint Co., Ltd.) separately made ready for use, 15 parts by weight of a nickel powder with an average particle diameter of 0.03 $\mu$m and further diluting the dispersion with desalted water to 15% by weight as concentration of a mixture of the resin and the powder, a conductive film 3 of 20 $\mu$m thick was formed on the whole surface of the insulating film 4 under the same conditions as those for the formation of the insulating film 4.

Then, using the same electro-deposition coating composition as used for the insulating film 4, an insulating film 5 of 15 $\mu$m thick was further formed on the whole surface of the conductive film 3 under the same conditions as those for the formation of the insulating film 4.

Finally, the resulting substrate was washed with water and then put the substrate in an oven of 97° C.±1° C. to carry out heat treatment for 150 minutes. A circuit substrate of the present invention was thus obtained.

Physical properties (adhesion, resistance to acids, resistance to alkalis and resistance to flame), insulation resistance, specific volume resistance and electromagnetic wave shielding effect of the resulting circuit substrate were evaluated or measured in the same manner as in Example 1. As a result, the same good results as in Example 1 were obtained.

The cross section of this circuit substrate was also observed in the same manner as in Example 1 to confirm that all the films were formed in uniform thicknesses.

EXAMPLE 8

A circuit substrate of the present invention was prepared in the same manner as in Example 1 except that 15 parts by weight of the nickel-coated alumina powder used in Example 1 was replaced with a mixture of 7 parts by weight of nickel-coated alumina powder and 5 parts by weight of copper powder. Coating thickness of the nickel-coated alumina powder was 0.2 μm. Average particle diameter of the alumina powder was 1.2 μm. Average particle diameter of the copper powder was 0.03 μm.

Physical properties (adhesion, resistance to acids, resistance to alkalis and resistance to flame), insulation resistance, specific volume resistance and electromagnetic wave shielding effect of the resulting circuit substrate were evaluated or measured in the same manner as in Example 1. As a result, the same good results as in Example 1 were obtained.

The cross section of this circuit substrate was also observed in the same manner as in Example 1 to confirm that all the films were formed in uniform thicknesses.

EXAMPLE 9

A circuit substrate of the present invention was prepared in the same manner as in Example 6 except that 10 parts by weight of the copper powder used in Example 6 was replaced with a mixture of 5 parts by weight of nickel-coated alumina powder and 10 parts by weight of copper powder. Coating thickness of the nickel-coated alumina powder was 0.2 μm. Average particle diameter of the alumina powder was 1.0 μm. Average particle diameter of the copper powder was 0.02 μm.

Physical properties (adhesion, resistance to acids, resistance to alkalis and resistance to flame) and electromagnetic wave shielding effect of the resulting circuit substrate were evaluated or measured in the same manner as in Example 1. As a result, the same good results as in Example 1 were obtained.

The cross section of this circuit substrate was also observed in the same manner as in Example 1 to confirm that all the films were formed in uniform thicknesses.

EXAMPLE 10

A circuit substrate of the present invention was prepared in the same manner as in Example 4 except that 7 parts by weight of the nickel-coated alumina powder used in Example 4 was replaced with a mixture of 7 parts by weight of copper-coated alumina powder and 5 parts by weight of nickel powder. Coating thickness of the copper-coated alumina powder was 0.2 μm. Average particle diameter of the alumina powder was 1.0 μm. Average particle diameter of the nickel powder was 0.03 μm.

Physical properties (adhesion, resistance to acids, resistance to alkalis and resistance to flame) insulation resistance, specific volume resistance and electromagnetic wave shielding effect of the resulting circuit substrate were evaluated or measured in the same manner as in Example 1. As a result, the same good results as in Example 1 were obtained.

The cross section of this circuit substrate was also observed in the same manner as in Example 1 to confirm that all the films were formed in uniform thicknesses.

EXAMPLE 11

On a glass epoxy resin substrate of 0.6 mm thick, a copper circuit pattern was formed in the same manner as in Example 1.

Thereafter, using an electro-deposition coating composition prepared by dispersing, in an acrylic melamine resin (trade name: Honey Bright CL-1; produced by Honey Chemical Co.), aluminum nitride with an average particle diameter of 1.5 μm in a concentration of 3% by weight of the resin and then diluting the dispersion with desalted water to 15% by weight as concentration of a mixture of the resin and the powder, a DC voltage of 150 V was applied for 3 minutes under conditions of pH 8.5 and a bath temperature of 25° C., setting the substrate as the anode and a stainless steel sheet as the cathode. Thus an insulating film 4 of 15 μm in thickness and 25% by weight in deposition quantity of the powder was formed on the copper circuit pattern.

Next, in an electro-deposition coating composition prepared by dispersing, in 100 parts by weight of an acrylic melamine resin (trade name: Honey Bright CL-1; produced by Honey Chemical Co.) separately made ready for use, 10 parts by weight of an alumina powder with an average particle diameter of 1.0 μm whose particle surfaces were coated with nickel in a thickness of 0.1 μm and further diluting the dispersion with desalted water to 15% by weight as concentration of a mixture of the resin and the powder, a conductive film 3 of 17 μm in thickness and 30% by weight in deposition quantity of the powder was formed on the whole surface of the insulating film 4 under the same conditions as those for the formation of the insulating film 4.

Then, using the same electro-deposition coating composition as used for the insulating film 4, an insulating film 5 of 15 μm thick was further formed on the whole surface of the conductive film 3 under the same conditions as those for the formation of the insulating film 4.

Finally, the resulting substrate was washed with water and then put the substrate in an oven of 97° C.±1° C. to carry out heat treatment for 150 minutes. A circuit substrate of the present invention was thus obtained.

Physical properties (adhesion, resistance to acids, resistance to alkalis and resistance to flame), insulation resistance, specific volume resistance, hardness (pencil) and resistance to scratching (eraser) of the resulting circuit substrate were evaluated or measured. Results obtained are shown in Tables 4 to 6 below.

The resulting insulating film and conductive film were dense and well adhered to adjoining films, having satisfactory resistance to acids, resistance to alkalis, resistance to flame, hardness, and resistance to scratching.

The electromagnetic wave shielding effect of the circuit substrate was also measured by the transmission line method after it was set in an apparatus. As a result, the electromagnetic wave shielding effect was as good as that in Example 1.

The cross section of this circuit substrate was also observed in the same manner as in Example 1 to confirm that all the films were formed in uniform thicknesses.

TABLE 4

| | Results of Evaluation on Physical Properties of Film | | | | |
|---|---|---|---|---|---|
| Adhesion | Resistance to acids | Resistance to alkalis | Resistance to flame | Hardness | <1> |
| Example 11:* | | | | | |
| Adhesion rate: 100/100 Completely adhered. | No changes in insulating film. | No changes in insulating film. | Cleared 94V-0. | 4 H | >700 |
| Comparative Example 1: | | | | | |
| See | See | See | See | 2 H | <100* |

TABLE 4-continued

Results of Evaluation on Physical Properties of Film

| Adhesion | Resistance to acids | Resistance to alkalis | Resistance to flame | Hardness | <1> |
|---|---|---|---|---|---|
| Table 1. | Table 1. | Table 1. | Table 1. | to H | |

<1>: Resistance to scratching
*times
Notes:
Tests on the items in the above table were carried out by the following methods:
(1) Adhesion: JIS D0202
(2) Resistance to acid: Immersion treatment with 10 Vol. % $H_2SO_4$ at room temperature for 20 minutes.
(3) Resistance to alkali: Immersion treatment with 5 wt. % NaOH at room temperature for 30 minutes.
(4) Resistance to flame: UL94 Test Method.
(5) Hardness: JIS K5400
(6) Resistance to scratching: The times required until the substrate was exposed when the insulating film was rubbed with an eraser.

TABLE 5

Insulation Resistance of Film

| | Initial value | After 96 hour moisture absorption treatment |
|---|---|---|
| Example 1: | $1.3 \times 10^{13} \, \Omega \cdot cm$ | $1.2 \times 10^{13} \, \Omega \cdot cm$ |

Notes:
The insulation resistance in the above table was measured according to JIS Z3197; comb electrode G-10; substrate moisture absorption treatment: at 55° C., 98% RH, DC 500 V for 1 minute. The resistivity was measured using a insulation resistance measuring device HP4329A, manufactured by YHP Co.

TABLE 6

Specific Volume Resistance of Film

| | Initial value | After 96 hour moisture absorption treatment |
|---|---|---|
| Example 1: | $1.0 \times 10^{13} \, \Omega \cdot cm$ | $1.3 \times 10^{13} \, \Omega \cdot cm$ |

Notes:
The above specific resistivity was measured according to JIS C6481.

EXAMPLE 12

On a glass epoxy resin substrate of 0.6 mm thick, a copper circuit pattern was formed in the same manner as in Example 1.

Thereafter, an insulating film 4 was formed thereon in the same manner as in Example 11 except that 3% by weight of the aluminum nitride powder used for the insulating film 4 in Example 11 was replaced with 5% by weight of an alumina powder with an average particle diameter of 1.0 μm.

Next, in an electo-deposition coating composition prepared by dispersing, in 100 parts by weight of an acrylic malamine resin (trade name: Honey Bright CL-1; produced by Honey Chemical Co.) separately made ready for use, 15 parts by weight of an alumina powder with an average particle diameter of 1.0 μm whose particle surfaces were coated with nickel in a thickness of 0.3 μm and further diluting the dispersion with desalted water to 15% by weight as concentration of a mixture of the resin and the powder, a conductive film 3 of 15 μm in thickness and 27% by weight in deposition quantity of the powder was formed on the whole surface of the insulating film 4 under the same conditions as those for the formation of the insulating film 4.

Then, using the same electro-deposition coating composition as used for the insulating film 4, an insulating film 5 of 15 μm thick was further formed on the whole surface of the conductive film 3 under the same conditions as those for the formation of the insulating film 4.

Finally, the resulting substrate was washed with water and then put the substrate in an oven of 97° C.±1° C. to carry out heat treatment for 150 minutes. A circuit substrate of the present invention was thus obtained.

Physical properties (adhesion, resistance to acids, resistance to alkalis, resistance to flame, hardness, and resistance to scratching), insulation resistance, specific volume resistance and electromagnetic wave shielding effect of the resulting circuit substrate were evaluated or measured in same manner as in Example 11. As a result, the same good results as in Example 11 were obtained.

The cross section of this circuit substrate was also observed in the same manner as in Example 11 to confirm that all the films were formed in uniform thicknesses.

EXAMPLE 13

On a glass epoxy resin substrate of 0.6 mm thick, a copper circuit pattern was formed in the same manner as in Example 1.

Thereafter, using an electro-deposition coating composition prepared by dispersing, in an alkyd resin (trade name: TF121; produced by Shinto Paint Co., Ltd.), silicon carbide with an average particle diameter of 2.0 μm in a concentration of 1% by weight of the resin and then diluting the dispersion with desalted water to 15% by weight as concentration of a mixture of the resin and the powder, a DC voltage of 150 V was applied for 3 minutes under conditions of pH 8.5 and a bath temperature of 25° C., setting the substrate as the anode and a stainless steel sheet as the cathode. Thus an insulating film 4 of the 15 μm in thickness and 25% by weight in deposition quantity of the powder was formed on the copper circuit pattern.

Next, in an electro-deposition coating composition prepared by dispersing, in 100 parts by weight of an alkyd resin (trade name: TF121; produced by Shinto Paint Co., Ltd.) separately made ready for use, 10 parts by weight of an alumina powder with an average particle diameter of 1.0 82 m whose particle surfaces were coated with copper in a thickness of 0.2 μm and further diluting the dispersion with desalted water to 15% by weight as concentration of a mixture of the resin and the powder, a conductive film 3 of 17 μm in thickness and 30% by weight in deposition quantity of the powder was formed on the whole surface of the insulating film 4 under the same conditions as those for the formation of the insulating film 4.

Then, using the same electro-deposition coating composition as used for the insulating film 4, an insulating film 5 of 15 μm thick was further formed on the whole surface of the conductive film 3 under the same conditions as those for the formation of the insulating film 4.

Finally, the resulting substrate was washed with water and then put the substrate in an oven of 97° C.±1° C. to carry out heat treatment for 150 minutes. A circuit substrate of the present invention was thus obtained.

Physical properties (adhesion, resistance to acids, resistance to alkalis, resistance to flame, hardness, and resistance to scratching), insulation resistance, specific volume resistance and electromagnetic wave shielding effect of the resulting circuit substrate were evaluated or measured in the same manner as in Example 11. As a result, the same good results as in Example 11 were obtained.

The cross section of this circuit substrate was also observed in the same manner as in Example 11 to confirm that all the films were formed in uniform thicknesses.

EXAMPLE 14

On glass epoxy resin substrate of 0.6 mm thick, a copper circuit pattern was formed in the same manner as in Example 1.

Thereafter, an insulating film 4 was formed thereon in the same manner as in Example 11 except that 3% by weight of the aluminum nitride powder used for the insulating film 4 in Example 11 was replaced with 1.5% by weight of an alumina powder with an average particle diameter of 5.6 μm.

Next, the same conductive film 3 as in Example 11 was formed in the same manner as in Example 11.

Finally, the resulting substrate was washed with water and then put the substrate in an oven of 97° C.±1° C. to carry out heat treatment for 150 minutes. A circuit substrate of the present invention was thus obtained.

Physical properties (adhesion, resistance to acids, resistance to alkalis, resistance to flame, hardness, and resistance to scratching) and electromagnetic wave shielding effect of the resulting circuit substrate were evaluated or measured in the same manner as in Example 11. As a result, the same good results as in Example 11 were obtained.

The cross section of this circuit substrate was also observed in the same manner as in Example 11 to confirm that all the films were formed in uniform thickness.

EXAMPLE 15

On a glass epoxy resin substrate of 0.6 mm thick, a copper circuit pattern and an insulating film 4 were formed in the same manner as in Example 1.

Thereafter, the same conductive film 3 as in Eaxample 5 was formed in the same manner as in Example 5.

Then, the same insulating film 5 as in Example 11 was formed in the same manner as in Example 11, and finally the coatings were cured in the same manner as in Example 11. A circuit substrate of the present invention was thus obtained.

Physical properties (adhesion, resistance to acids, resistance to alkalis, resistance to flame, hardness, and resistance to scratching), insulation resistance, specific volume resistance and electromagnetic wave shielding effect of the resulting circuit substrate were evaluated or measured in the same manner as in Example 11. As a result, the same good results as in Example 11 were obtained.

The cross section of this circuit substrate was also observed in the same manner as in Example 11 to confirm that all the films were formed in uniform thicknesses.

EXAMPLE 16

A circuit substrate of the present invention was prepared in the same manner as in Example 12 except that 10 parts by weight of the nickel-coated alumina powder used for the conductive film 3 in Example 12 was replaced with 5 parts by weight of a silver powder with an average particle diameter of 0.02 μm.

Physical properties (adhesion, resistance to acids, resistance to alkalis, resistance to flame, hardness, and resistance to scratching), insulation resistance, specific volume resistance and electromagnetic wave shielding effect of the resulting circuit substrate were evaluated or measured in the same manner as in Example 11. As a result, the same good results as in Example 11 were obtained.

The cross section of this circuit substrate was also observed in the same manner as in Example 11 to confirm that all the films were formed in uniform thicknesses.

EXAMPLE 17

On a glass epoxy resin substrate of 0.6 mm thick, a copper circuit pattern was formed in the same manner as in Example 1.

Thereafter, an insulating film 4, a conductive film 3 and an insulating film 5 were formed thereon in the same manner as in Example 11, Example 8 and Example 11, respectively.

Physical properties (adhesion, resistance to acids, resistance to alkalis, resistance to flame, hardness, and resistance to scratching), insulation resistance, specific volume resistance and electromagnetic wave shielding effect of the resulting circuit substrate were evaluated or measured in the same manner as in Example 11. As a result, the same good results as in Example 11 were obtained.

The cross section of this circuit substrate was also observed in the same manner as in Example 11 to confirm that all the films were formed in uniform thicknesses.

I claim:

1. A circuit substrate comprising a substrate, a conductive circuit pattern provided on said substrate, a first insulating film that covers said conductive circuit pattern, and a conductive film that covers said first insulating film, wherein both said first insulating film and said conductive film are formed by electro-depositing coating.

2. A circuit substrate according to claim 1, wherein said conductive film is covered with a second insulating film.

3. A circuit substrate according to claim 2, wherein said second insulating film is formed by electro-deposition coating.

4. A circuit substrate according to claim 1, wherein said first insulating film comprises a ceramic powder.

5. A circuit substrate according to claim 3, wherein said second insulating film comprises a ceramic powder.

6. A circuit substrate according to claim 1, wherein said conductive film comprises a conductive powder.

7. A circuit substrate according to claim 6, wherein said conductive powder comprises a material selected from the group consisting of a metallized ceramic powder and a metallized natural mica powder.

8. A circuit substrate according to claim 6, wherein said conductive powder comprises a mixture selected from the group consisting of a metallized ceramic powder and a metallized natural mica powder and a material selected from the group consisting of a metallized resin powder and a metal powder.

9. A circuit substrate according to claim 1 wherein a second insulating film is provided to cover said conductive film, and said first insulating film, said conductive film and said second insulating film are all formed by electro-deposition coating.

10. A process for producing a circuit substrate, comprising a first step of forming on a substrate a circuit pattern comprising a conductor wire, a second step of porviding a first insulating film to cover the circuit pattern, and a third step of providing a conductive film to cover the first insulating film, wherein said second step and said third step each comprises an electro-deposition coating, said electro-deposition coating being carried out by immersing said substrate in an electro-deposition coating composition, and setting the conductor wire as an electrode.

11. A process for producing a circuit substrate according to claim 10, wherein the step of forming said conductive film is followed by a fourth step of providing a second insulating film to cover the conductive film.

12. A process for producing a circuit substrate according to claim 11, wherein said fourth step comprises an elector-deposition coating.

13. A process for producing a circuit substrate according to claim 10, wherein said second step comprises said electro-deposition coating, and wherein a ceramic powder is incorporated into said elecro-deposition coating composition to form the first insulating film.

14. A process for producing a circuit substrate according to claim 10, wherein third step comprises said electro-deposition coating and wherein a conductive powder is incorporated into said electro-deposition coating composition to form the conductive film.

15. A process for producing a circuit substrate according to claim 14, wherein said conductive powder comprises a material selected from the group consisting of a metallized ceramic powder and a metallized natural mica powder.

16. A process for producing a circuit substrate according to claim 14, wherein said conductive powder comprises a mixture selected from the group consisting of a metallized ceramic powder and a metallized natural mica powder and a material selected from the group consisting of metallized resin powder and a metal powder.

17. A process for producing a circuit substrate according to cliam 10, wherein said fourth step comprises said electro-depositing coating, and wherein a ceramic powder is incorporated into said electro-deposition coating composition to form the second insulating film.

18. A process for producing a circuit substrate according to claim 10, wherein a fourth step is provided to form a second insulating film that covers the conductive film, and wherein said second step, said third step and said fourth step each comprises an electro-deposition.

* * * * *

UNITED STATES PATENT AND TRADEMARK OFFICE
CERTIFICATE OF CORRECTION

PATENT NO. : 5,158,657
DATED : October 27, 1992
INVENTOR(S) : SUSUMU KADOKURA

It is certified that error appears in the above-identified patent and that said Letters Patent is hereby corrected as shown below:

COLUMN 1

Line 35, "a this" should read --a circuit. This--.
Line 55, "can" should read --that can--.

COLUMN 4

Line 48, "deposition" (second occurrence) should be deleted.

COLUMN 15

Line 47, "electo-deposition" should read
--electro-deposition--.

COLUMN 16

Line 41, "1.0 82 m" should read --1.0 µm--.

COLUMN 17

Line 15, "5.6" should read --5.0--.

COLUMN 18

Line 60, "1 wherein" should read --1, wherein--.
Line 68, "porviding" should read --providing--.

UNITED STATES PATENT AND TRADEMARK OFFICE
CERTIFICATE OF CORRECTION

PATENT NO. : 5,158,657
DATED : October 27, 1992
INVENTOR(S) : SUSUMU KADOKURA

It is certified that error appears in the above-identified patent and that said Letters Patent is hereby corrected as shown below:

COLUMN 19

Line 16, "elector-deposition" should read
--electro-deposition--.
Line 20, "elecro-deposition" should read
--electro-deposition--.
Line 24, "wherein third" should read --wherein said third--.

Signed and Sealed this

Thirtieth Day of November, 1993

Attest:

BRUCE LEHMAN

Attesting Officer

Commissioner of Patents and Trademarks